United States Patent [19]

Morris

[11] 4,200,474
[45] Apr. 29, 1980

[54] METHOD OF DEPOSITING TITANIUM DIOXIDE (RUTILE) AS A GATE DIELECTRIC FOR MIS DEVICE FABRICATION

[75] Inventor: Henry B. Morris, Plano, Tex.

[73] Assignee: Texas Instruments Incorporated, Dallas, Tex.

[21] Appl. No.: 962,259

[22] Filed: Nov. 20, 1978

[51] Int. Cl.² .................. H01L 21/285; H01L 21/324
[52] U.S. Cl. ....................................... 148/1.5; 29/571; 148/187; 357/4; 357/54; 357/23; 423/592; 423/598; 423/610; 427/79; 427/91; 427/124; 427/250
[58] Field of Search .................. 148/1.5, 187; 427/50, 427/79, 91, 123, 124, 226, 250; 423/592, 598, 608, 610; 357/4, 54, 23; 29/571

[56] References Cited

U.S. PATENT DOCUMENTS

| | | | |
|---|---|---|---|
| 3,201,667 | 8/1965 | Varga | 357/54 X |
| 3,409,429 | 11/1968 | Ekman et al. | 423/610 X |
| 3,470,609 | 10/1969 | Breitweiser | 357/54 X |
| 3,533,850 | 10/1970 | Tarneja et al. | 357/54 X |
| 3,615,873 | 10/1971 | Sluss et al. | 148/1.5 |
| 3,615,947 | 10/1971 | Yamada | 357/54 X |
| 3,646,665 | 3/1972 | Kim | 148/187 |
| 3,663,279 | 5/1972 | Lepselter | 357/54 X |
| 3,686,544 | 8/1972 | Steigman et al. | 357/23 X |
| 3,690,945 | 9/1972 | Kuisl | 357/54 X |
| 3,731,163 | 5/1973 | Shuskus | 357/23 X |

OTHER PUBLICATIONS

Burkhardt et al., "Post Oxidation Annealing . . . Fixed Charge Levels", I.B.M. Tech. Discl. Bull., vol. 18, No. 3, Aug. 1975, p. 753.
Wang et al., "Vapor Deposition . . . Metal Oxide Thin Films . . . " R.C.A. Review, Dec. 1970, pp. 728–741.
Agusta et al., "Metal—Insulator—Trap—Oxide Semiconductor Memory Cell", I.B.M. Tech Discl. Bull., vol. 13, No. 12, May 1971, p. 3636.
Romankiw, L. T., "Forming MgO on Top of Al₂O₃ . . . Application" I.B.M. Tech. Discl. Bull. vol. 16, No. 4, Sep. 1973, p. 1094.

Primary Examiner—L. Dewayne Rutledge
Assistant Examiner—W. G. Saba
Attorney, Agent, or Firm—Ronald A. Williamson; William E. Hiller; Richard L. Donaldson

[57] ABSTRACT

The invention is embodied in a novel method of forming titanium dioxide layers for metal-insulator-semiconductor device dielectrics. The titanium dioxide of a type known as rutile is formed by the deposition of titanium metal upon a layer of silicon dioxide and oxidation of titanium in an oxygen ambient at high temperatures.

7 Claims, 9 Drawing Figures

METHOD OF DEPOSITING TITANIUM DIOXIDE (RUTILE) AS A GATE DIELECTRIC FOR MIS DEVICE FABRICATION

BACKGROUND OF THE INVENTION

This invention is directed to a method of providing insulating material on a semiconductor substrate, and more particularly, to a method of providing an insulating layer of titanium dioxide in a form known as rutile upon a silicon semiconductor substrate.

Since the invention of metal insulator semiconductor (MIS) field effect transistors, the insulator that has been used almost exclusively has been silicon dioxide. There are several reasons for this, not the least of which is the compatibility with standard semiconductor fabrication technology. Oxidation of silicon to form silicon dioxide is one of the simplest, most accurate and most frequently used procedures in the semiconductor fabrication process. The use of silicon dioxide has worked well for many years, and it continues to be the most used insulator for MIS devices. As integrated circuits have become more and more dense, the individual MOS devices on them have become smaller and smaller. As the device size is reduced, the oxide thickness must be reduced accordingly to achieve corresponding size reductions. However, as this oxide thickness is reduced, the oxide becomes more susceptible to process-induced defects, such as pinholes, which made it difficult to obtain satisfactory device yields. Consequently, there has been an effort to use insulators with higher dielectric constants so that the insulator thickness can be maintained thick enough to avoid the thin oxide problem and yet not significantly affect device threshold voltages. Devices have been built using a combination of silicon dioxide and silicon nitride, but the dielectric constant of nitride is only about twice as high as silicon dioxide and the improvement has generally not been worth the extra processing effort. Titanium dioxide is an insulator which can exist in three crystalline forms: anatase, brookite and rutile. Rutile is the more thermodynamically stable of the three forms and in polycrystalline form has a dielectric constant of approximately 125, which is 32 times larger than that of silicon dioxide. Some work has previously been done using rutile as an optical coating. This work is described in a paper by G. Hass, Vacuum, Vol. II, No. 4, October, 1952, pp. 331-345. In forming rutile as an optical coating, pure titanium metal was evaporated upon glass and then oxidized.

SUMMARY OF THE INVENTION

The invention is embodied in a novel method of forming titanium dioxide layers for the gate dielectric (insulator) in MIS transistor structures. A thin layer of silicon dioxide is grown in the gate areas. Then, the titanium dioxide of a type known as rutile is formed by first evaporating titanium metal upon a silicon slice patterned with photoresist. The titanium upon the photoresist is popped off and the slice is placed in a high temperature furnace in an oxygen ambient to convert the titanium to titanium dioxide. Titanium dioxide remains upon the thin layer of silicon dioxide.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein:

DETAILED DESCRIPTION OF SPECIFIC EMBODIMENT

Figure 1:
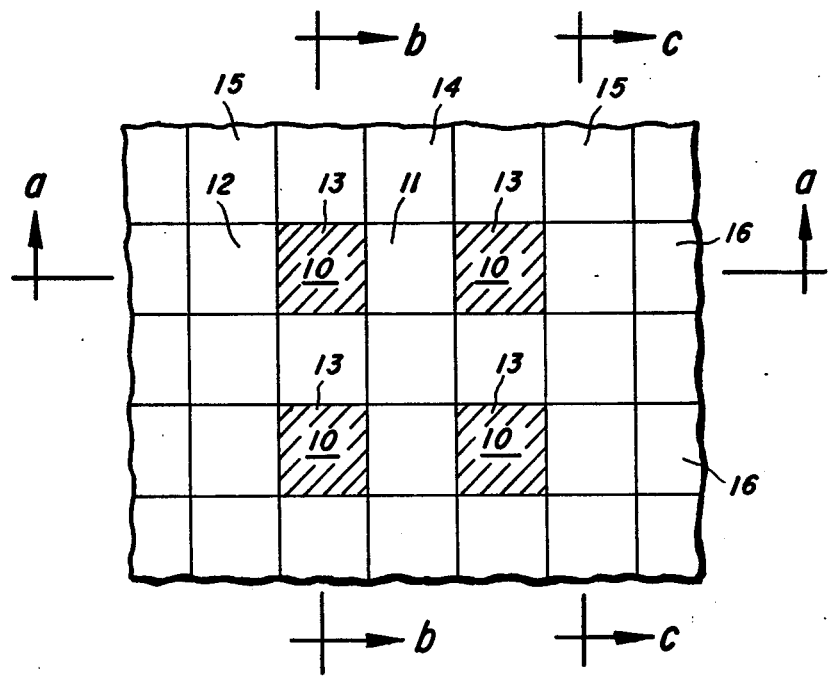
FIG. 1 is a greatly enlarged plan view of a small portion of a semiconductor chip showing the physical layout of an array of MIS transistors.
Figure 2:
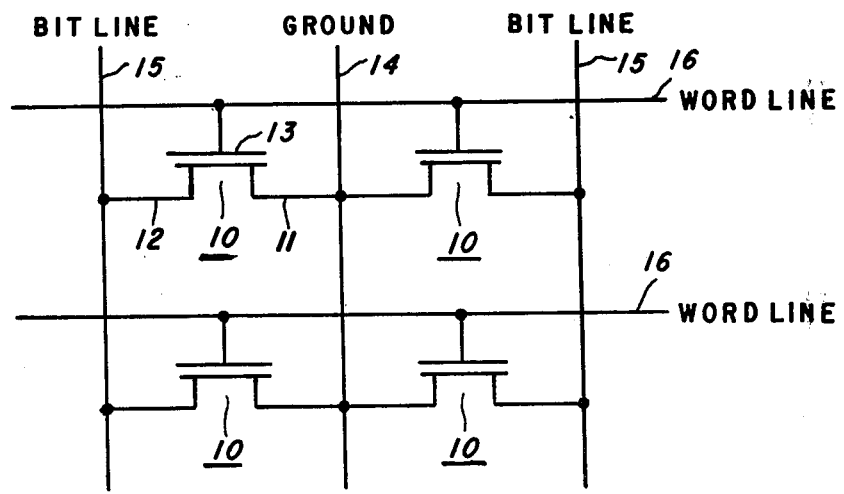
FIG. 2 is an electrical schematic of the array of FIG. 1.

Referring to FIG. 1, a physical layout of an array of MIS transistors using the gate dielectric of the invention is shown. The array is of course greatly enlarged in FIG. 1 as each transistor could occupy less than 1 square mil. The transistor 10 comprises a source 11, drain 12 and gate 13, all of which are also seen in the electrical schematic diagram of FIG. 2.

Figure 3:
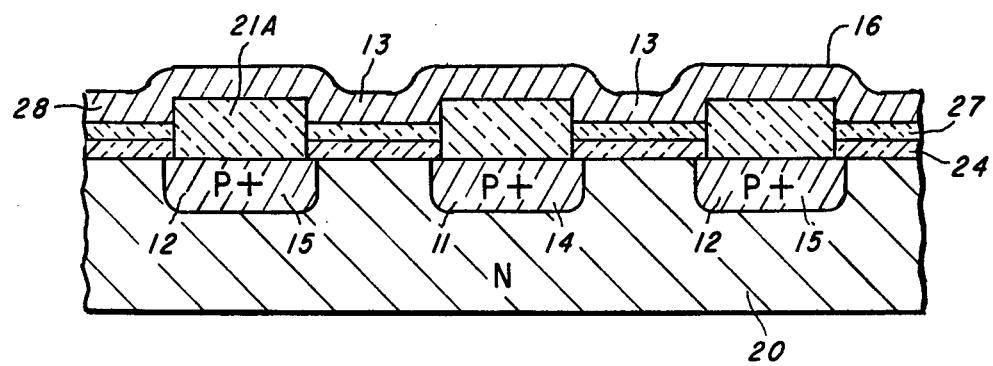
FIG. 3 is an elevation view in section of the transistors of FIG. 1, taken along the line a-a.
Figure 4:
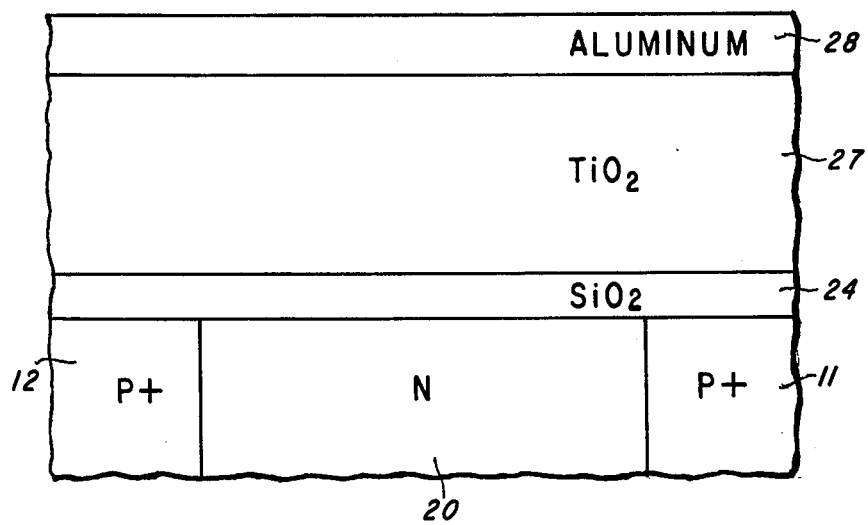
FIG. 4 is a greatly enlarged view of an area of the section of FIG. 3.

Referring to FIGS. 3 and 4, sectional views of the memory transistors of FIG. 1 show the details of construction. It should be kept in mind when examining the section views that not all geometries, junction depths and layer thicknesses are necessarily to scale, some having been enlarged or reduced where necessary to reflect features of the invention. The source 11 of the transistor 10 is part of a diffused region forming the ground line 14. A drain region 12 is provided by a diffused region which forms a bit line 15. An elongated strip 28 of aluminum forms the transistor gate 13 and is also a word line 16. The gate dielectric is composed of a layer 24 of silicon dioxide and a layer 27 of titanium dioxide.

Figure 5A:
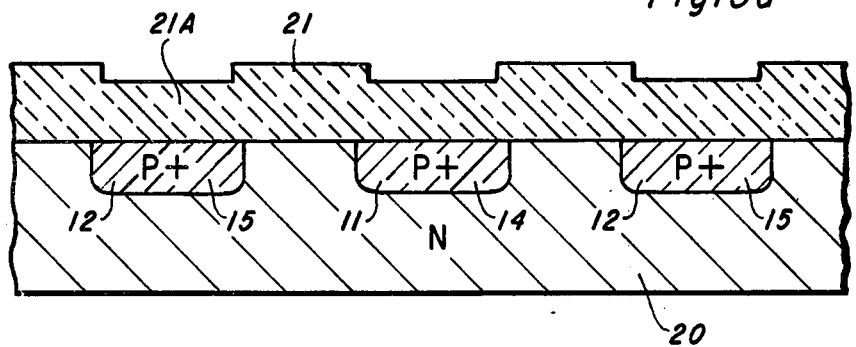
FIGS. 5a-5e are elevation views in section of the transistors of FIG. 1 taken along the line a-a at successive stages in the manufacturing process.

Referring to FIGS. 5a-5e, a process for making the transistors of FIG. 1 is described. The starting slice is N-type monocrystalline silicon, perhaps 3 inches in diameter, cut on the 100 plane with a resistivity of perhaps 8-10 ohms-cm. The first stage of the process is the formation of the source and drain regions 11, 12. First, an oxide layer 21 is grown on the slice by subjecting the slice to a steam ambient in a high temperature furnace tube. Then, a layer of photoresist is applied and patterned, removing resist from areas where sources and drains are desired. All patterning techniques used are known, and therefore no elaboration will be necessary. The oxide layer not covered with photoresist is removed by subjecting the slice to an oxide etch. The resist is removed and the slice is subjected to a high temperature furnace operation whereby boron is "deposited" in a surface adjacent region in the source and drain areas. The excess doping material is removed and the "deposited" boron is diffused further into the slice, completing the source and drain formation, by subjecting the slice to an oxidizing ambient in a high temperature furnace tube. During the diffusion step, an oxide layer 21A is grown over the source and drain areas. FIG. 5a represents the slice at this point in the process.

Figure 5B:
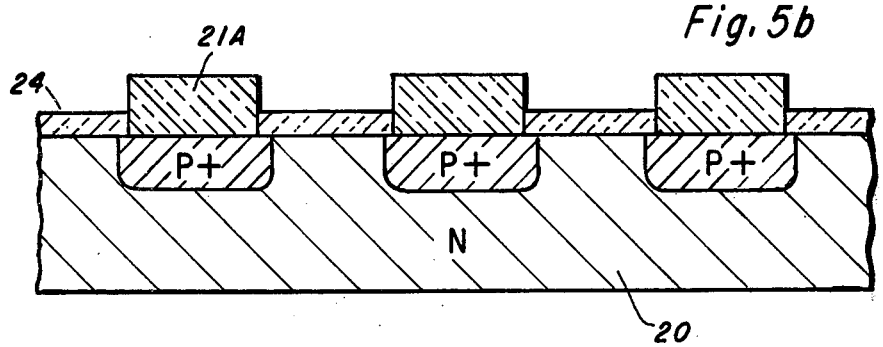

The next step of the process is to begin formation of the gate dielectric. A layer of photoresist is applied and patterned, removing the resist from areas where the gate dielectric is to be formed. The oxide not covered with photoresist is removed by subjecting the slice to an oxide etch. The photoresist is then removed. The slice is then subjected to an oxygen ambient in a high temperature furnace tube at about 900 Degrees C. for perhaps 25 minutes to form an oxide layer 24 in the gate dielectric areas. The oxide layer 24 is grown to a thickness of 50-500 Angstroms, preferably 100-300 Angstroms. FIG. 5b represents the slice at this point in the process. The thickness of this oxide is primarily going to determine the threshold voltage of the transistors since the titanium dioxide, because of its very high dielectric constant, acts as an extension of the gate. Therefore, it is important to accurately control the thickness of this oxide layer 24.

Figure 5C:
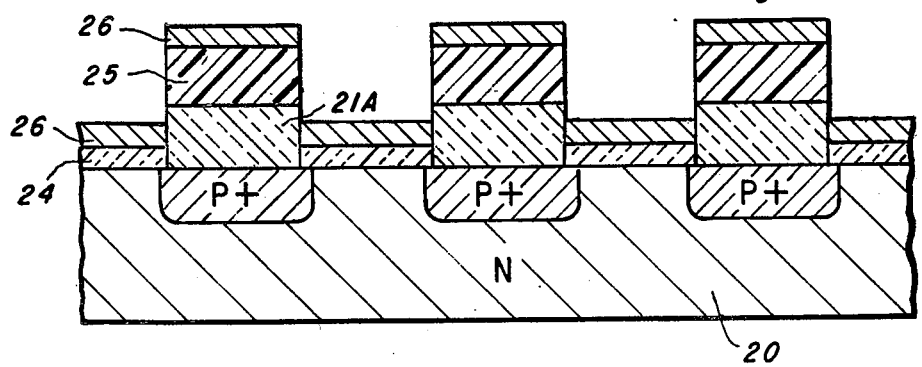
Figure 5D:
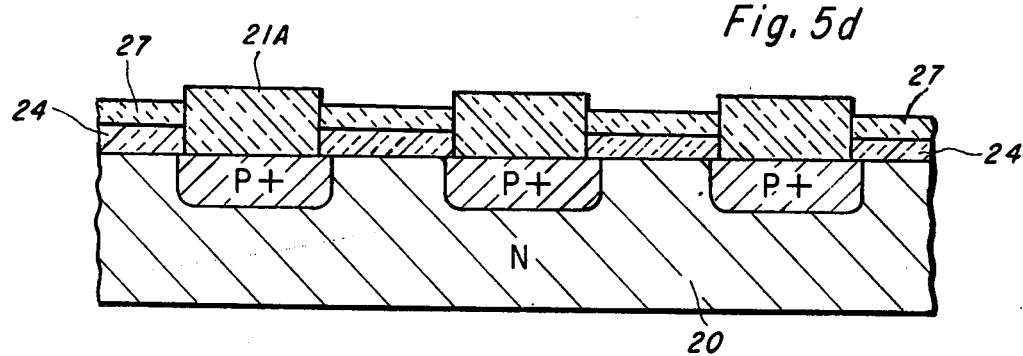

The next stage of the process is the formation of the titanium dioxide layer. The formation of the titanium dioxide is the key feature of the invention. There are several ways in which the titanium dioxide could be formed. First, titanium could be evaporated upon the slice, patterned using conventional photomasking and etching techniques, and then oxidized to form titanium dioxide. Second, a layer of resist could be applied to the slice and patterned, removing the resist from areas where titanium dioxide is desired. Then, titanium dioxide would be evaporated upon the patterned resist and popped off from those areas where resist is located. The technique chosen is described as follows. The reason this technique is chosen is that it does not require the etching of titanium dioxide. As far as a practical production technique is concerned, titanium dioxide is almost impossible to etch. A coating of photoresist 25 is applied and patterned, leaving photoresist in those areas where titanium is not desired. The slice is then placed in an e-gun metal evaporator, and a layer 26 of titanium is evaporated upon the slice patterned with photoresist. The titanium is evaporated to a thickness of about 250-3000 Angstroms, preferably 1100 Angstroms, leaving the slice as shown in FIG. 5c. The titanium upon the photoresist is then popped off using conventional techniques. The photoresist is then removed, and the slice is subjected to an oxygen ambient in a high temperature furnace tube at 200-1200 degrees C., preferably 700 degrees C., for perhaps 2 hours. This oxidation step converts the titanium layer 26 to a layer 27 of titanium dioxide of a form known as rutile. It is important not to oxidize titanium too long or a mixed oxide of anatase, brookite and rutile will be formed. When the titanium is converted to titanium dioxide, it increases in thickness by about 77 percent. This completes the formation of the gate dielectric and leaves the slice as shown in FIG. 5d.

It is important in forming rutile by the oxidation of titanium upon a silicon slice, that there be a layer of silicon dioxide, silicon nitride or some other material upon the silicon when the titanium is evaporated. If this is not done, the titanium will react with the silicon during the oxidation step and form titanium silicide, a conductor. The native oxide on a silicon slice (approximately 30 Angstroms thick) is not of sufficient thickness to prevent the silicide formation. It appears that 50 Angstroms of silicon dioxide is the minimum amount necessary to prevent the formation of titanium silicide during the oxidation of 1100 Angstroms of titanium. It is necessary to keep the oxidation temperature about 200 Degrees C. to form rutile because at temperatures below 200 Degrees C., the titanium will oxidize to form mixtures of anatase, brookite and rutile. Anatase and brookite have dielectric constants of less than 40 and are therefore undesirable substitutes for rutile.

The next stage of the process is the formation of the device contacts. Note there are none in the array of transistors, so none are shown in the Figures. First, a layer of photoresist is applied to the slice and then patterned, with resist being removed from areas where the contacts are desired. The silicon dioxide not covered with resist is removed by subjecting the slice to an oxide etchant. The resist is then removed, completing the formation of the device contacts.

Figure 5E:
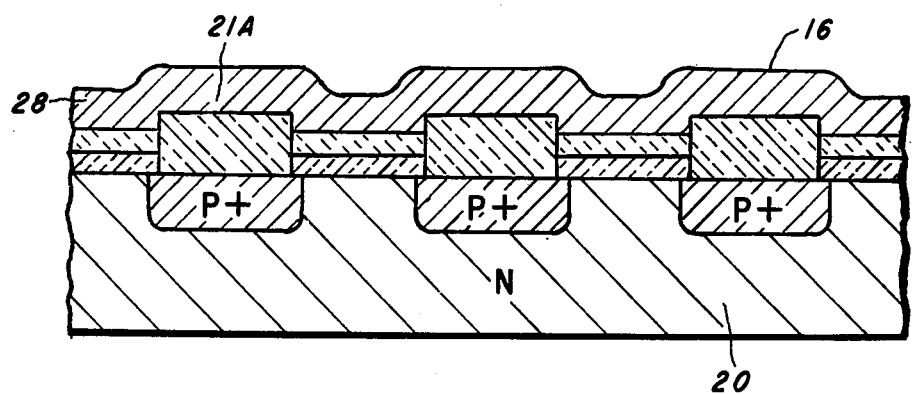

The last stage of the process is the formation of the metal interconnects. The slice is placed in a metal evaporator, and a layer 28 of aluminum is evaporated upon the slice. A coating of photoresist is applied and patterned leaving resist where metal interconnects are desired. The areas of aluminum not covered with resist are removed by subjecting the slice to an aluminum etchant. The resist is removed, and the slice is subjected to a hydrogen ambient in a high temperature furnace tube to sinter the aluminum interconnects, thereby completing the fabrication process, and leaving the slice as shown in FIG. 5e. This anneal is not only important to sinter the aluminum but improves the qualities of the rutile. Before the anneal, the dielectric constant of rutile is less than 125 but increases to this value after the anneal. The resistivity of the rutile increases by $10^2$–$10^4$ as a result of the anneal. Presumably, these results are due to the annealing of x-ray damage induced during the e-beam evaporation of aluminum.

Titanium dioxide occurs in three crystalline forms: anatase, brookite and rutile, a tetragonal modification. Rutile is the most thermodynamically stable form of titanium dioxide and has an extraordinarily large anisotropic dielectric constant. Its dielectric constant is approximately 200 parallel to its optic axis and 86.4 perpendicular to its optic axis, both measured at 10 KHZ. Since rutile has two perpendicular axes and one parallel axis, a polycrystalline rutile film with totally random crystalline orientation should have a dielectric constant of approximately 125.

To be useful as a gate dielectric, a dielectric must have a resistivity of $10^{12}$–$10^{16}$ ohm-cm depending on the particular device in which it is used. To obtain rutile with a resistivity greater than or equal to $10^{13}$ ohm-cm requires good stoichiometry, a minimization of the oxygen vacancies and titanium interstitials in the rutile. Although rutile can be formed with acceptable resistivities, it still cannot be used directly upon the silicon as a gate dielectric. One reason mentioned earlier had to do with the formation of titanium silicide during the oxidation of the titanium. The other reason is when rutile or other non-silicon dioxide insulators are put directly upon silicon, there is a large density of surface states and interfacial fixed charge density which renders it useless as a gate dielectric. This is the reason rutile is formed upon silicon dioxide. The superior Si-SiO$_2$ interface characteristics are maintained, yet improvements are realized because of the high dielectric constant.

Titanium oxidizes to form titanium dioxide in much the same manner as silicon oxidizes to form silicon dioxide, although the oxidization rate of titanium is much faster than that of silicon. With respect to time, titanium exhibits logarithmic, parabolic, or linear oxidation rates depending on the oxidation temperature and thickness of titanium dioxide above the titanium. As previously mentioned, to form only rutile, the titanium must be oxidized at temperatures in excess of 200 Degrees C. or else mixtures of anatase, brookite an rutile will be formed.

The operation of the transistors with the silicon dioxide/titanium dioxide gate dielectric is the same as when the gate dielectric is silicon dioxide. However, the insulator thickness using the dielectric combination of the invention can be much larger than silicon dioxide for the same device threshold voltage because the high dielectric constant (approximately 125) of the titanium dioxide results in very little voltage drop when a voltage is applied to the gate. The thickness of the oxide layer 24 beneath the titanium dioxide 27 determines to a large extent the capacitance per unit area of the dual dielectric and its dielectric breakdown voltage. In essence, the titanium dioxide is like an extension of the gate metal with the important property that it is non-conducting and plugs any pinholes in the thin silicon dioxide.

While this invention has been described with reference to an illustrative embodiment, using titanium dioxide as a gate dielectric in MOS transistors, it is not intended that this description be construed in a limiting sense. For example, titanium dioxide could be used for the dielectric for MIS capacitors to yield a very high capacitance per unit area. This high capacitance per unit area can be used to increase the charge storage per unit area in CCDs and dynamic RAMs for improved performance. Also, examination of the equations governing the operation of MIS transistors immediately shows that both the source-drain conductance and transconductance are directly proportional to the capacitance of the gate per unit area. Therefore, a titanium dioxide/silicon dioxide gate dielectric could be used for increasing the conductances of MIS transistors without increasing their width/length ratio. Or equivalently, the width/length ratios could be decreased without sacrificing conductance. This would be advantageous in both linear and power devices or IC's.

Various other modifications of the illustrative embodiment, as well as other embodiments of the invention, will be apparent to persons skilled in the art upon reference to this description. It is therefore contemplated that the appended claims will cover any such modifications of embodiments as fall within the true scope of the invention.

What is claimed is:

1. A method of forming a layer of titanium dioxide on a substrate of semiconductor material, comprising:

forming an insulating layer of a controlled thickness on a substrate of semiconductor material;

depositing a layer of titanium metal on the insulating layer;

thermally oxidizing the layer of titanium metal in a dry oxygen atmosphere at a temperature maintained in excess of 200 Degrees C.; and converting the layer of titanium metal into a titanium dioxide layer of rutile form in response to the thermal oxidation thereof.

2. A method of forming a layer of titanium dioxide on a substrate of semiconductor material, comprising:

providing a substrate of monocrystalline silicon of one type conductivity;

growing an oxide layer on the silicon substrate to a controlled thickness of the order of 50–500 Angstroms;

depositing a layer of titanium metal onto the silicon oxide layer of controlled thickness;

subjecting the titanium metal layer to oxidation in a heated environment at a temperature maintained in excess of 200 Degrees C.; and converting the titanium metal layer into a titanium dioxide layer of rutile form in response to its subjection to oxidation.

3. A method as set forth in claim 2 wherein the oxide layer is grown on the substrate to a controlled thickness of the order of 100–300 Angstroms.

4. A method as set forth in claim 2 wherein the growing of the oxide layer on the substrate is accomplished by subjecting an exposed surface of the substrate to an oxygen atmosphere at an elevated temperature of the order of 900 Degrees C.; and forming an oxide layer on the exposed surface of the substrate to a controlled thickness in response to the subjection of the exposed surface of the substrate to the heated oxygen atmosphere.

5. A method as set forth in claim 2 wherein the layer of titanium metal is deposited onto the silicon oxide layer of controlled thickness by evaporation.

6. A method as set forth in claim 2 further including subjecting the rutile-form titanium dioxide layer to a heat anneal treatment in a hydrogen atmosphere.

7. A method as set forth in claim 2 wherein the layer of titanium metal is deposited onto the silicon oxide layer of controlled thickness to a thickness of the order of 250–3000 Angstroms.

* * * * *